(12) United States Patent
Savage

(10) Patent No.: US 7,154,416 B1
(45) Date of Patent: Dec. 26, 2006

(54) ADAPTIVE CONTROL OF CODEBOOK REGENERATION IN DATA COMPRESSION MECHANISMS

(75) Inventor: Ken J. Savage, Vancouver (CA)

(73) Assignee: Packeteer, Inc., Cupertino, CA (US)

( * ) Notice: Subject to any disclaimer, the term of this patent is extended or adjusted under 35 U.S.C. 154(b) by 0 days.

(21) Appl. No.: 11/233,872

(22) Filed: Sep. 22, 2005

(51) Int. Cl.
*H03M 7/34* (2006.01)
*G06F 12/06* (2006.01)

(52) U.S. Cl. .......................... 341/51; 711/212; 711/220

(58) Field of Classification Search .................. 341/50, 341/51, 106, 107; 711/154, 220, 212
See application file for complete search history.

(56) References Cited

U.S. PATENT DOCUMENTS

| | | | | |
|---|---|---|---|---|
| 5,255,090 A | * | 10/1993 | Israelsen | ................ 375/240.12 |
| 5,530,645 A | * | 6/1996 | Chu | ............................ 715/532 |
| 5,889,891 A | * | 3/1999 | Gersho et al. | .............. 382/253 |
| 6,430,672 B1 | * | 8/2002 | Dhong et al. | ................ 711/220 |
| 6,489,902 B1 | * | 12/2002 | Heath | ........................... 341/87 |
| 6,526,574 B1 | * | 2/2003 | Jones | ......................... 717/168 |
| 6,529,912 B1 | * | 3/2003 | Satoh et al. | ................. 707/101 |

\* cited by examiner

*Primary Examiner*—Peguy JeanPierre
(74) *Attorney, Agent, or Firm*—Mark J. Spolyar

(57) ABSTRACT

Adaptive control of codebook regeneration in data compression mechanisms. In one implementation, the present invention provides a means controlling the frequency of codebook updates based on expected performance gains resulting from codebook regeneration. The present invention, in one implementation, employs a mechanism that simulates the expected compression performance of a hypothetically, updated codebook. A compression module compares the simulated compression performance to the actual performance of the codebook used to compress the data, and updates the codebook if a threshold condition is satisfied.

19 Claims, 7 Drawing Sheets

ADAPTIVE CONTROL OF CODEBOOK REGENERATION IN DATA COMPRESSION MECHANISMS

CROSS-REFERENCE TO RELATED APPLICATIONS

This application makes reference to the following commonly owned U.S. patent applications and patents, which are incorporated herein by reference in their entirety for all purposes:

U.S. patent application Ser. No. 08/762,828 now U.S. Pat. No. 5,802,106 in the name of Robert L. Packer, entitled "Method for Rapid Data Rate Detection in a Packet Communication Environment Without Data Rate Supervision;"

U.S. patent application Ser. No. 08/970,693 now U.S. Pat. No. 6,018,516, in the name of Robert L. Packer, entitled "Method for Minimizing Unneeded Retransmission of Packets in a Packet Communication Environment Supporting a Plurality of Data Link Rates;"

U.S. patent application Ser. No. 08/742,994 now U.S. Pat. No. 6,038,216, in the name of Robert L. Packer, entitled "Method for Explicit Data Rate Control in a Packet Communication Environment without Data Rate Supervision;"

U.S. patent application Ser. No. 09/977,642 now U.S. Pat. No. 6,046,980, in the name of Robert L. Packer, entitled "System for Managing Flow Bandwidth Utilization at Network, Transport and Application Layers in Store and Forward Network;"

U.S. patent application Ser. No. 09/106,924 now U.S. Pat. No. 6,115,357, in the name of Robert L. Packer and Brett D. Galloway, entitled "Method for Pacing Data Flow in a Packet-based Network;"

U.S. patent application Ser. No. 09/046,776 now U.S. Pat. No. 6,205,120, in the name of Robert L. Packer and Guy Riddle, entitled "Method for Transparently Determining and Setting an Optimal Minimum Required TCP Window Size;"

U.S. patent application Ser. No. 09/479,356 now U.S. Pat. No. 6,285,658, in the name of Robert L. Packer, entitled "System for Managing Flow Bandwidth Utilization at Network, Transport and Application Layers in Store and Forward Network;"

U.S. patent application Ser. No. 09/198,090 now U.S. Pat. No. 6,412,000, in the name of Guy Riddle and Robert L. Packer, entitled "Method for Automatically Classifying Traffic in a Packet Communications Network;"

U.S. patent application Ser. No. 09/198,051, in the name of Guy Riddle, entitled "Method for Automatically Determining a Traffic Policy in a Packet Communications Network;"

U.S. patent application Ser. No. 09/206,772, now U.S. Pat. No. 6,456,360, in the name of Robert L. Packer, Brett D. Galloway and Ted Thi, entitled "Method for Data Rate Control for Heterogeneous or Peer Internetworking;"

U.S. patent application Ser. No. 09/710,442, in the name of Todd Krautkremer and Guy Riddle, entitled "Application Service Level Mediation and Method of Using the Same;"

U.S. patent application Ser. No. 09/966,538, in the name of Guy Riddle, entitled "Dynamic Partitioning of Network Resources;"

U.S. patent application Ser. No. 10/015,826 in the name of Guy Riddle, entitled "Dynamic Tunnel Probing in a Communications Network;"

U.S. patent application Ser. No. 10/039,992, in the name of Michael J. Quinn and Mary L. Laier, entitled "Method and Apparatus for Fast Lookup of Related Classification Entities in a Tree-Ordered Classification Hierarchy;"

U.S. patent application Ser. No. 10/108,085, in the name of Wei-Lung Lai, Jon Eric Okholm, and Michael J. Quinn, entitled "Output Scheduling Data Structure Facilitating Hierarchical Network Resource Allocation Scheme;"

U.S. patent application Ser. No. 10/178,617, in the name of Robert E. Purvy, entitled "Methods, Apparatuses and Systems Facilitating Analysis of Network Device Performance;"

U.S. patent application Ser. No. 10/155,936 now U.S. Pat. No. 6,591,299, in the name of Guy Riddle, Robert L. Packer, and Mark Hill, entitled "Method For Automatically Classifying Traffic With Enhanced Hierarchy In A Packet Communications Network;"

U.S. patent application Ser. No. 10/236,149, in the name of Brett Galloway and George Powers, entitled "Classification Data Structure enabling Multi-Dimensional Network Traffic Classification and Control Schemes;"

U.S. patent application Ser. No. 10/334,467, in the name of Mark Hill, entitled "Methods, Apparatuses and Systems Facilitating Analysis of the Performance of Network Traffic Classification Configurations;"

U.S. patent application Ser. No. 10/453,345, in the name of Scott Hankins, Michael R. Morford, and Michael J. Quinn, entitled "Flow-Based Packet Capture;"

U.S. patent application Ser. No. 10/676,383 in the name of Guy Riddle, entitled "Enhanced Flow Data Records Including Traffic Type Data;"

U.S. patent application Ser. No. 10/720,329, in the name of Weng-Chin Yung, Mark Hill and Anne Cesa Klein, entitled "Heuristic Behavior Pattern Matching of Data Flows in Enhanced Network Traffic Classification;"

U.S. patent application Ser. No. 10/812,198 in the name of Michael Robert Morford and Robert E. Purvy, entitled "Adaptive, Application-Aware Selection of Differentiated Network Services;"

U.S. patent application Ser. No. 10/843,185 in the name of Guy Riddle, Curtis Vance Bradford and Maddie Cheng, entitled "Packet Load Shedding;"

U.S. patent application Ser. No. 10/938,435 in the name of Guy Riddle, entitled "Classification and Management of Network Traffic Based on Attributes Orthogonal to Explicit Packet Attributes;"

U.S. patent application Ser. No. 11/027,744 in the name of Mark Urban, entitled "Adaptive Correlation of Service Level Agreement and Network Application Performance;" and U.S. patent application Ser. No. 11/082,638 in the name of Li Fang and Mary L. Laier, entitled "Adaptive Network Traffic Compression Mechanism Including Dynamic Selection of Compression Algorithms."

FIELD OF THE INVENTION

The present invention relates to data compression and, more particularly, to adaptive codebook generation and processing in data compression methodologies.

BACKGROUND OF THE INVENTION

Businesses are growing increasingly dependent on distributed computing environments and wide area computer networks to accomplish critical tasks. Indeed, a wide variety of business applications are deployed across intranet, extranet and Internet connections to effect essential communications with workers, business partners and customers. As the number of users, applications and external traffic increases, however, network congestion forms, impairing business application performance. Enterprise network managers, therefore, are constantly challenged with determining the volume, origin and nature of network traffic to align network resources with business priorities and applications.

Data compression, caching and other technologies that optimize or reduce the size of network traffic flows can be deployed to improve the efficiency and performance of a computer network, and ease congestion at bottleneck links. For example, implementing data compression and/or caching technology can improve network performance by reducing the amount of bandwidth required to transmit a given block of data between two network devices along a communications path. Data compression technologies can be implemented on routing nodes (or other network devices in a communications path) without alteration of client or server end systems, or software applications executed therein, to reduce bandwidth requirements along particularly congested portions of a communications path. For example, tunnel technologies, like those used in Virtual Private Network (VPN) implementations, establish tunnels through which network traffic is transformed upon entering at a first network device in a communications path and restored to substantially the same state upon leaving a second network device.

A variety of compression algorithms and technologies have been developed, such as run-length encoding (RLE), Huffman encoding, Lempel-ziv compression (e.g., LZ77, LZ78, etc.), Lempel-Ziv-Welch (LZW) compression, fixed library compression, and combinations/variants of the foregoing compression methods. All compression methods have their own advantages and tradeoffs. It is generally understood that no single compression method is superior for all applications and data types. The most beneficial choice of compression tools and libraries for a particular network application depends on the characteristics of the data and application in question: streaming versus file; expected patterns and regularities in the data; relative importance of CPU usage, memory usage, channel demands and storage requirements; and other factors.

In the realm of data compression, there frequently exists a data structure known as a codebook. A codebook is a mapping between an incoming symbol (or bit pattern) and an outgoing symbol or bit pattern. This outbound representation generally consists of a bit pattern having a given length. By assigning shorter length bit patterns to the more frequently-encountered incoming bit patterns, data compression aims to reduce the amount of overall data requiring storage or transmission. The act of analyzing incoming symbol probabilities and determining the optimal outgoing bit patterns is called codebook generation, which can often be a computationally intensive operation.

Data compression mechanisms may use static or dynamic codebooks. For example, to adapt to changing data characteristics, dynamic compression systems regenerate or update the codebook used to compress a data stream in response to the history of input bit patterns or symbols. Due to the CPU-intensive nature of codebook regeneration, however, the effective throughput of a data compression system can be reduced by the amount of time spent maintaining the codebook. For example, Adaptive Huffman compression can update the codebook after every input symbol, after 'N' input symbols, or after processing a given block of input data. In the first case, this compression scheme adapts to changing input data very effectively, but at a higher CPU cost. In the second case, selection of larger 'N' values reduces the use of CPU resources for codebook regeneration, but sacrifices the adaptability of the compression algorithm, possibly resulting in poor compression performance. The third case is similar to the second case where longer blocks of data result in poorer adaptability, potentially reduced compression performance, but better CPU usage. On the other end of the spectrum, Static Huffman compression relies on a single codebook, either selected from a knowledgebase of codebooks, or computed once for an incoming data block. As a result, CPU usage for codebook generation is significantly reduced at the expense, however, of adaptability and possibly compression performance.

Prior art compression mechanisms, however, do not balance the effect on throughput of codebook regeneration against the expected gain in compression performance and data throughput. Indeed, an update to a codebook may not yield a significant effect in the compression ratio, and/or ultimately the effective data throughput, achieved by a compression system. Accordingly, CPU resources (and thus throughput during codebook regeneration) may be expected with little to no resulting gain in data throughput or performance. In light of the foregoing, a need in the art exists for methods, apparatuses and systems directed to controlling codebook updates to reduce the effect on data throughput of unnecessary codebook regeneration.

SUMMARY OF THE INVENTION

The present invention provides methods, apparatuses and systems directed to adaptive control of codebook regeneration in data compression mechanisms. In one implementation, the present invention provides a means controlling the frequency of codebook updates based on expected performance gains resulting from codebook regeneration. The present invention, in one implementation, employs a mechanism that simulates the expected compression performance of a hypothetically, updated codebook. A compression module compares the simulated compression performance to the actual performance of the codebook used to compress the data, and updates the codebook if a threshold condition is satisfied. In one implementation, the adaptive compression functionality of the present invention can be integrated into network application traffic management systems and performance enhancing proxies.

DESCRIPTION OF PREFERRED EMBODIMENT(S)

Figure 1:
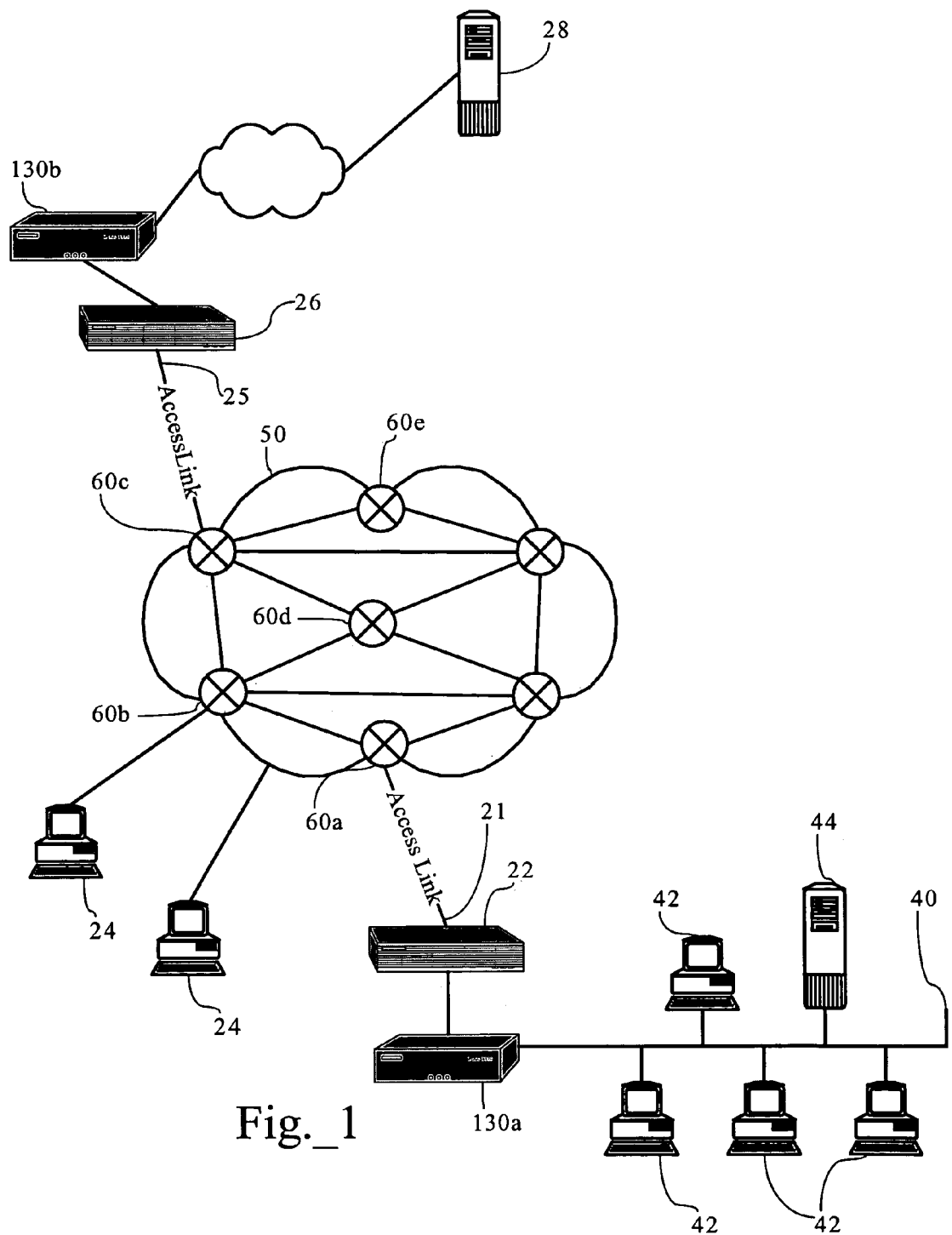
FIG. 1 is a functional block diagram illustrating a computer network system architecture in which an embodiment of the present invention may operate.

FIG. 1 illustrates a packet-based computer network environment including data compression devices 130a, 130b. As FIG. 1 shows, local area computer network 40 interconnects several TCP/IP end systems, including client devices 42 and server device 44, and provides access to resources operably connected to computer network 50 via router 22 and access link 21. Server 28 is a TCP/IP end system connected to computer network 50 through router 26 and access link 25. Client devices 24 are additional TCP/IP end systems operably connected to computer network 50 by any suitable means, such as through an Internet Services Provider (ISP). The computer network environment, including computer network 50 is a packet-based communications environment, employing TCP/IP and other network protocols and has a plurality of interconnected digital packet transmission stations or routing nodes 60a–60e. As FIG. 1 shows, data compression device 130a is provided between router 22 and local area computer network 40, while data compression device 130b is disposed between router 26 and server 28. Data compression devices 130a, 130b are operative to establish a compression tunnels with routing nodes or other network devices in a computer network environment that include compatible compression tunnel capabilities. Data compression devices 130a, 130b, in one implementation, are further operative to identify routing nodes or other network devices (such as each other) along a communications path to a destination host that include compatible compression tunnel capabilities. In one embodiment, data compression devices 130a, 130b are also operable to classify data flows and, depending on the classification, selectively apply different compression algorithms depending on the classification of the data flows.

A. Data Compression Device

Figure 2:
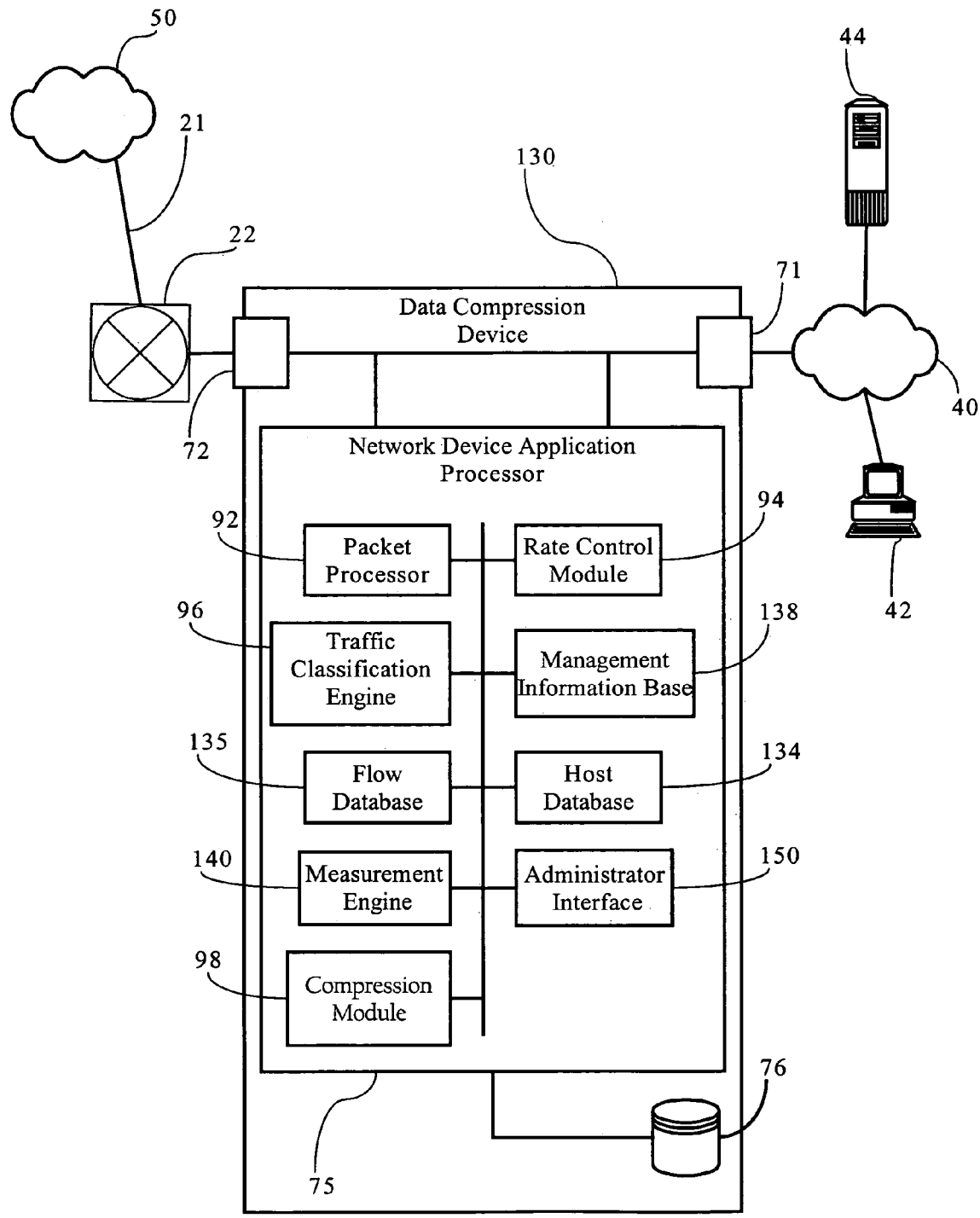
FIG. 2 is a functional block diagram illustrating the functionality of a data compression device, according to one implementation of the present invention.

As FIG. 2 illustrates, data compression device 130, in one implementation, comprises network device application processor 75, and first and second network interfaces 71, 72, which operably connect data compression device 130 to the communications path between router 22 and network 40. Network device application processor 75 generally refers to the functionality implemented by data compression device 130, such as network traffic classification, data compression, and the like. In one embodiment, network device application processor 75 is a combination of hardware and software, such as a central processing unit, memory, a system bus, an operating system, device drivers, and one or more software modules implementing the functions performed by data compression device 130. For didactic purposes, data compression device 130 is configured to establish tunnels with remote network devices, and compress/de-compress network traffic traversing access link 21. The above-identified patents and patent applications, incorporated by reference herein, disclose various functionalities and features that may be incorporated into data compression devices according to various implementations of the present invention.

In one embodiment, first and second network interfaces 71, 72 are the hardware communications interfaces that receive and transmit packets over the computer network environment. In one implementation, first and second network interfaces 71, 72 reside on separate network interface cards operably connected to the system bus of data compression device 130. In another implementation, first and second network interfaces reside on the same network interface card. In addition, the first and second network interfaces 71, 72 can be wired network interfaces, such as Ethernet (IEEE 802.3) interfaces, and/or wireless network interfaces, such as IEEE 802.11, BlueTooth, satellite-based interfaces, and the like. As FIG. 2 illustrates, data compression device 130, in one embodiment, includes persistent memory 76, such as a hard disk drive or other suitable memory device, such writable CD, DVD, or tape drives. In other implementations, data compression device 130 can include additional network interfaces, beyond network interfaces 71 and 72, to support additional access links or other functionality. Furthermore, U.S. application Ser. No. 10/843,185 provides a description of the operation of various modules (according to one possible implementation of the present invention), such as network interface drivers, and data structures for receiving into memory and processing packets encountered at network interfaces 71, 72.

Figure 7:
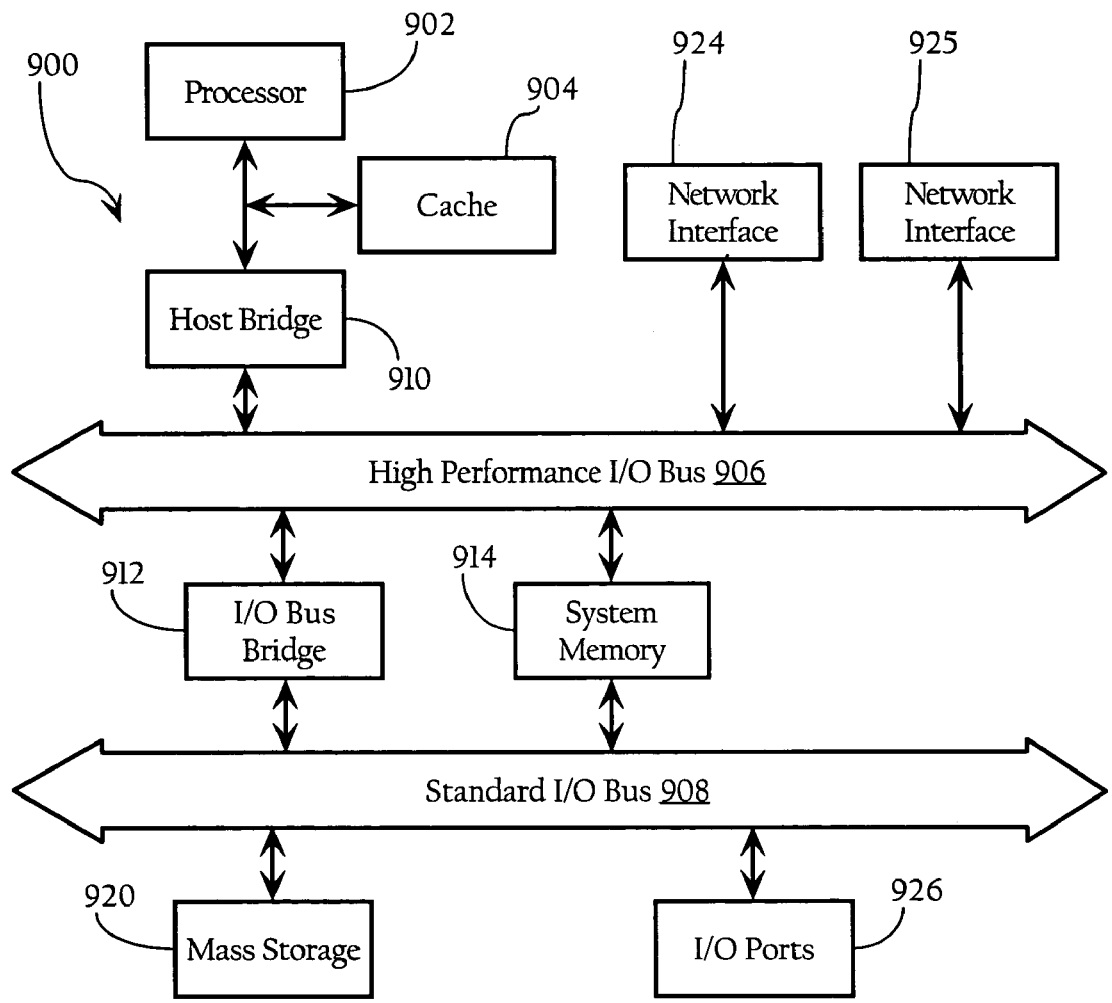
FIG. 7 is functional block diagram illustrating the hardware components of a data compression device according to one implementation of the present invention.

FIG. 7 illustrates for didactic purposes an exemplary computing platform, and hardware architecture, for data compression device 130. In one implementation, data compression device 130 comprises a processor 902, a system memory 914, network interfaces 924 & 925, and one or more software applications (including network device application 75 shown in FIG. 2) and drivers enabling the functions described herein.

The present invention can be implemented on a wide variety of computer system architectures. For example, FIG. 7 illustrates, hardware system 900 having components suitable for network device 30 in accordance with one implementation of the present invention. In the illustrated embodiment, the hardware system 900 includes processor 902 and a cache memory 904 coupled to each other as shown. Additionally, the hardware system 900 includes a high performance input/output (I/O) bus 906 and a standard I/O bus 908. Host bridge 910 couples processor 902 to high performance I/O bus 906, whereas I/O bus bridge 912 couples the two buses 906 and 908 to each other. Coupled to bus 906 are network/communication interface 924, and system memory 914. The hardware system may further include video memory (not shown) and a display device coupled to the video memory. Coupled to bus 908 are mass storage 920 and I/O ports 926. The hardware system may optionally include a keyboard and pointing device (not shown) coupled to bus 908. Collectively, these elements are intended to represent a broad category of computer hardware systems, including but not limited to general purpose computer systems based on the Pentium® processor manufactured by Intel Corporation of Santa Clara, Calif., as well as any other suitable processor.

The elements of computer hardware system 900 perform their conventional functions known in the art. In particular, network interfaces 924, 925 are used to provide communication between system 900 and any of a wide range of networks, such as an Ethernet (e.g., IEEE 802.3) network, etc. Mass storage 920 is used to provide permanent storage for the data and programming instructions to perform the above described functions implemented in the system controller, whereas system memory 914 (e.g., DRAM) is used to provide temporary storage for the data and programming instructions when executed by processor 902. I/O ports 926 are one or more serial and/or parallel communication ports used to provide communication between additional peripheral devices, which may be coupled to hardware system 900.

Hardware system 900 may include a variety of system architectures, and various components of hardware system 900 may be rearranged. For example, cache 904 may be on-chip with processor 902. Alternatively, cache 904 and processor 902 may be packed together as a "processor module," with processor 902 being referred to as the "processor core." Furthermore, certain implementations of the present invention may not require nor include all of the above components. For example, the peripheral devices shown coupled to standard I/O bus 908 may be coupled to high performance I/O bus 906. In addition, in some implementations only a single bus may exist with the components of hardware system 900 being coupled to the single bus. Furthermore, additional components may be included in system 900, such as additional processors, storage devices, or memories.

As discussed above, in one embodiment, the operations of data compression device 130 are implemented as a series of software routines run by hardware system 900. These software routines comprise a plurality of series of instructions to be executed by a processor in a hardware system, such as processor 902. Initially, the series of instructions are stored on a storage device, such as mass storage 920. However, the series of instructions can be stored on any conventional storage medium, such as a diskette, CD-ROM, ROM, etc. Furthermore, the series of instructions need not be stored locally, and could be received from a remote storage device, such as a server on a network, via network/communication interface 924. The instructions are copied from the storage device, such as mass storage 920, into memory 914 and then accessed and executed by processor 902.

An operating system manages and controls the operation of system 900, including the input and output of data to and from software applications (not shown). The operating system provides an interface between the software applications being executed on the system and the hardware components of the system. According to one embodiment of the present invention, the operating system is the Windows® 95/98/NT/XP operating system, available from Microsoft Corporation of Redmond, Wash. However, the present invention may be used with other conventional operating systems, such as the Apple Macintosh Operating System, available from Apple Computer Inc. of Cupertino, Calif., UNIX operating systems, LINUX operating systems, and the like. Of course, other implementations are possible. For example, the functionality of data compression device 130 may be implemented by a plurality of server blades communicating over a backplane.

As FIG. 2 illustrates, network device application processor 75, in one embodiment, includes a packet processor 92, rate control module 94, traffic classification engine 96, and compression module 98. Network device application processor 75, in one implementation, further comprises host database 134, flow database 135, measurement engine 140, management information base 138, and administrator interface 150. In one embodiment, the packet processor 92 is operative to process data packets, such as detecting new data flows, parsing the data packets for various attributes (such as source and destination addresses, and the like) and storing packet attributes in a buffer structure, and maintaining one or more flow variables or statistics (such as packet count, current rate, etc.) in connection with the data flows and/or the source/destination hosts. The traffic classification engine 96, as discussed more fully below, is operative to classify data flows based on one or more attributes associated with the data flows. Traffic classification engine 96, in one implementation, stores traffic classes associated with data flows encountered during operation of data compression device 130, as well as manually created traffic classes configured by a network administrator, in a hierarchical traffic class structure. In one implementation, rate control module 94 is operative to schedule data packets for egress from data compression device 130. In one implementation, rate control module 94 is operative to apply aggregate and per-flow bandwidth utilization controls to data flows traversing the access link 21 in the inbound and/or outbound directions. Data compression module 98 is operative to establish compression tunnels with remote network devices along network paths to destination hosts, as discussed more fully below. Data compression module 98 also adaptively controls codebook generation for at least one compression algorithm implemented by the module.

As discussed above, in one implementation, network device application processor 75 further comprises measurement engine 140, management information base (MIB) 138, and administrator interface 150. Management information base 138 is a database of standard and extended network objects related to the operation of data compression device 130. Measurement engine 140 maintains measurement and statistical data relating to operation of data compression device 130 to allow for monitoring of bandwidth utilization and network performance across access link 21 with respect to a plurality of network statistics on an aggregate and/or per-traffic-class level.

Administrator interface 150 facilitates the configuration of data compression device 130 to adjust or change operational and configuration parameters associated with the device. For example, administrator interface 150 allows administrators to select identified traffic classes and associate them with traffic management policies, such as partitions. In some implementations, administrator interface 150 allows administrators to selectively apply different compression algorithms, as well as the adaptive codebook generation functionality described herein, to one or more network applications or other traffic types. Administrator interface 150 also displays various views associated with a hierarchical traffic classification scheme and allows administrators to configure or revise the hierarchical traffic classification scheme. Administrator interface 150 can provide a command line interface and/or a graphical user interface accessible, for example, through a conventional browser on client device 42.

A.1. Packet Processing

As discussed above, packet processor 92, in one implementation, is operative to detect new data flows, instantiate data structures associated with the flows and parse packets to identify packet attributes, such as source and destination addresses, port numbers, etc., and populate one or more fields in the data structures. The U.S. Patents and patent applications identified above discuss the operation of packet processors that can be incorporated into embodiments of the present invention. In one embodiment, when packet processor 92 encounters a new data flow it stores the source and destination IP addresses contained in the packet headers in host database 134. Packet processor 92 further constructs a control block (flow) object in flow database 135 including attributes characterizing a specific flow between two end systems, such as source and destination port numbers, etc. Other flow attributes in the flow object may include application specific attributes gleaned from layers above the TCP layer, such as codec identifiers for Voice over IP calls, Citrix database identifiers, and the like. Packet processor 92 also stores meta information relating to the received packets in a packet buffer—a memory space, typically in dynamic random access memory (DRAM), reserved for packets traversing data compression device 130. In one embodiment, the packets are stored in the packet buffer with a wrapper including various information fields, such as the time the packet was received, the packet flow direction (inbound or outbound), and a pointer to the flow object corresponding to the flow of which the packet is a part. Other packet wrapper attributes can include fields related to the operation of compression module 98, such as active compression algorithm identifiers, and the like.

In typical network deployments, the majority of data flows are generally TCP or UDP flows. However, any suitable transport layer flow can be recognized and detected. As discussed more fully below, in one embodiment, flows are identified based on the following flow attributes: 1) source IP address, 2) destination IP address, 3) source port number, 4) destination port number, and 5) protocol (derived from the "protocol" field in IPv4 headers, and the "Next-Header" field in IPv6 headers). One skilled in the art will recognize that flows can be identified in relation to a variety of attributes and combinations of attributes. In addition, methods for determining new data flows and assigning packets to existing data flows are well known in the art and also depend on the particular transport layer protocol employed. For a TCP flow, for example, packet processor 92 can determine a new data flow by detecting SYN, SYN/ACK, and/or ACK packets. However, a new data flow, depending on the network protocol associated with the flow, can simply be a data flow for which there is no corresponding flow object. For example, with UDP and GRE flows (where there is no explicit connection or handshake mechanism, such as SYN packets), a new flow is recognized by associating the source and destination addresses and port numbers to the flow and the flow type (e.g., UDP, GRE, etc.). Accordingly, when a UDP packet identifies a new address/port pair, the attributes discussed above are stored in a data structure along with the time of last packet. A new UDP flow between the same address/port pairs can be determined by comparing the last packet time to a threshold value (e.g., 2 minutes). If the difference between the time of the last packet and the time of the current packet is greater than the threshold, the current packet is deemed part of a new flow. In another implementation, a background and/or separate process can periodically compare the last packet times associated with a flow to a threshold period of time and deem the flow terminated if the last packet time is beyond the threshold period of time. The termination of TCP connections is typically detected by identifying FIN packets; however, the timeout mechanisms discussed above can be used in situations where a FIN packet is not detected.

In one embodiment, a control block (flow) object contains a flow specification object including such attributes as pointers to the end system IP addresses in host database 134, as well as other flow specification parameters, such as inside and outside port numbers, service type (see below), protocol type and other parameters characterizing the data flow. In one embodiment, such parameters can include information gleaned from examination of data within layers 2 through 7 of the OSI reference model. U.S. Pat. Nos. 6,046,980 and U.S. 6,591,299, as well as others incorporated by reference herein, disclose classification of data flows for use in a packet-based communications environment. FIG. 2 illustrates the concept associated with inside and outside addresses, where network interface 71 is the "inside" network interface and network interface 72 is the "outside" network interface. As discussed above, in one embodiment, a flow specification object includes an "inside" and "outside" address relative to data compression device 130. See FIG. 1. For a TCP/IP packet, packet processor 92 can compute the inside and outside addresses based on the source and destination network addresses of the packet and the direction of the packet flow. Still further, packet processor 92 can also identify which host is the client and which host is the server for a given data flow and store this information in the flow specification or flow object. The identification of a server or client in a given transaction generally depends on the network protocols employed by the hosts. For example, in TCP flows, a client initiates a transaction by transmitting a SYN packet to initiate a TCP connection. Data compression device 130 can detect the SYN packet and note the source network address of the packet as the client host, and the destination address as the server host. One of ordinary skill in the art will recognize how to identify clients and servers in connection with other networking protocols.

In one embodiment, packet processor 92 creates and stores flow objects corresponding to data flows in flow database 135. In one embodiment, flow object attributes include a pointer to a corresponding flow specification object, as well as other flow state parameters, such as TCP connection status, timing of last packets in the inbound and outbound directions, speed information, apparent round trip time, packet count, etc. To facilitate operation of compression module 98, each flow object can also include compression state attributes, such as compression algorithm identifiers, remote tunnel endpoint information, and the like. Flow object attributes, in some implementations, further include at least one traffic class identifier (or pointer(s) thereto) associated with the data flow, as well as policy parameters (or pointers thereto) corresponding to the identified traffic class. In one embodiment, flow objects further include a list of traffic classes for which measurement data (maintained by measurement engine 140) associated with the data flow should be logged. In one embodiment, to facilitate identification of the flow and association of an existing flow object to subsequent packets associated with a data flow or connection, flow database 135 further maintains a control block hash table including a key comprising a hashed value computed from a string comprising the inside IP address, outside IP address, inside port number, outside port number, and protocol type (e.g., TCP, UDP, etc.) associated with a pointer to the corresponding flow object. According to this embodiment, to identify whether a flow object exists for a given data flow, packet processor 92 hashes the values identified above and scans the hash table for a matching entry. If one exists, packet processor 92 associates the pointer to the corresponding flow object with the packets in the data flow.

A.2. Traffic Classification

As discussed above, traffic classification engine 96, in one implementation, is operative to classify data flows into one of a plurality of traffic classes. Traffic classification engine 96, in one implementation, comprises a plurality of service type identification modules, each of which correspond to a set of service types or network applications. Each service type identification module analyzes one or more packets in a given data flow to attempt to identify a service type corresponding to the flow. A service type, in one implementation, can be a network protocol, a service, or other network application. For example, one service type identification module can correspond to a network application, such as Citrix®, while another service type identification module can be dedicated to detecting Oracle® or PostgreSQL database traffic. Still other service type identification modules can classify more broadly-defined network applications, such as HTTP flows, FTP flows, ICMP flows, RTP flows, NNTP, SMTP, SSL, DICOM and the like. In one implementation, traffic classification engine 96 passes pointers to received packets to each service type identification module, which then inspect the packets stored in the buffer memory. In one implementation, each service type identification module has an associated packet count threshold (in the aggregate, packets from server to client, or client to server) after which it no longer attempts to classify a data flow. In one implementation, the packet count threshold will vary across the service type identification modules. For example, a service type identification module dedicated to classifying Citrix® traffic may be able to classify a data flow with certainty after three packets. In many instances, data compression device 130 may have to encounter more than one packet corresponding to a data flow in order to finally classify the data flow. For example, the initial TCP handshake packets may only reveal IP address, port numbers and protocol identifiers. While this information may be sufficient to identify HTTP traffic, for example, additional packets (such as data packets) may reveal a more specific network application, such as an accounting application or peer-to-peer file sharing application, that utilizes HTTP. Accordingly, in one implementation, each service type identification module responds to receiving a pointer to a packet by 1) reporting a matching service type identifier and the desire to inspect more packets in the flow (to possibly identify a more specific service type identifier); 2) reporting a matching service type and no interest in inspecting subsequent packets in the flow; 3) reporting no matching service type identifier and the desire to inspect more packets in the flow; and 4) reporting no matching service type and no interest in inspecting subsequent packets in the flow.

To allow for identification of service types (e.g., FTP, HTTP, etc.), traffic classification engine 96, in one embodiment, is supported by one to a plurality of service identification tables in a relational database that allow for identification of a particular service type (e.g., application, protocol, etc.) based on the attributes of a particular data flow. Of course, other suitable data structures can be used to support the identification of service types, such as a set of hard-coded instructions, an XML file, and the like. In one embodiment, a services table including the following fields: 1) service ID, 2) service aggregate (if any), 3) name of service, 4) service attributes (e.g., port number, outside IP address, etc.) and a 5) default bandwidth management policy. A service aggregate encompasses a combination of individual services (each including different matching criteria, such as different port numbers, etc.) corresponding to the service aggregate. When data compression device 130 encounters a new flow, the service type identification modules of traffic classification engine 96 analyze the data flow against the service attributes in their respective services tables to identify a service ID corresponding to the flow. In one embodiment, traffic classification engine 96 may identify more than one service ID associated with the flow. In this instance, traffic classification engine 96 associates the more/most specific service ID to the flow. For example, network traffic associated with a peer-to-peer file sharing service may be identified according to a network protocol, such as TCP or HTTP traffic, as well as higher level, application-specific traffic types such as the actual file sharing application itself (e.g., Napster, Morpheus, etc.). In this instance, traffic classification engine 96 associates the flow with the most specific service ID. As a further example, an RTSP application data flow can be further classified to RTSP-Broadcast or RTSP-REALNET-TCP in the middle of the flow after a particular signature in the packets is encountered. In one implementation, traffic classification engine 96 writes the identified service type ID into the control block (flow) object corresponding to the data flow.

As discussed more fully below, service type identification, in one implementation, is a preliminary operation to the classification of a data flow according to the hierarchical traffic classification scheme configured by a network administrator. For example, a traffic class maintained by traffic classification engine 96 may be configured to include matching rules based on the service IDs in the services table. For example, a matching rule directed to HTTP traffic may simply refer to the corresponding service ID, as opposed to the individual attributes that the service type identification modules uses to initially identify the service. This implementation allows for a variety of hierarchical traffic classification configurations, such as the configuration of child traffic classes that further classify HTTP traffic on the basis of a network application, a range of IP addresses, and the like. Still further, the service type identifiers can correspond to a specific network application (e.g., Napster, Citrix, NetIQ, Oracle, Skype, etc.) and more generally to network protocols or services, such as IP, TCP, HTTP, SOAP, XML, UDP, FTP, SMTP, FTP, UDP, etc.

A traffic class comprises a set of matching rules or attributes allowing for logical grouping of data flows that share the same characteristic or set of characteristics. In one implementation, the matching rules can correspond to the service type identifiers discussed above, as well as other data flow attributes, such as the network interface on which the packets are received by data compression device 130, whether the server is the inside or outside host (see above), non-standard and standard port numbers, host IP address or subnet, MAC address, application-specific strings, diffserv codes, MPLS tags, VLAN tags, and the like. In one embodiment, each traffic class has at least one attribute defining the criterion(ia) used for identifying a specific traffic class. In one implementation, the attributes defining a given traffic class can be based on explicitly presented attributes of one or more packets corresponding to a data flow (as discussed above), or be based on behavioral attributes of the end systems associated with the flow. The U.S. patent applications identified above disclose various network traffic classification mechanisms that can be incorporated into embodiments of the present invention. For example, a traffic class can be defined by configuring an attribute defining a particular IP address or subnet. Of course, a particular traffic class can be defined in relation to a plurality of related and/or orthogonal data flow attributes. U.S. Pat. Nos. 6,412,000 and 6,591,299, and U.S. patent application Ser. No. 10/039,992 describe some of the data flow attributes that may be used to define a traffic class, as well as the use of hierarchical classification structures to associate traffic classes to data flows. In one embodiment, data compression device 130 includes functionality allowing for classification of network traffic based on information from layers 2 to 7 of the OSI reference model. Data compression device 130 can be configured to include matching rules that define a plurality of network applications commonly found in enterprise networks, such as database applications, Citrix® flows, ERP applications, and the like. As discussed below, the matching rules or attributes for a traffic class may be based on various types of node behavior, such as the number of concurrent connections of the inside or outside host.

In one embodiment, data compression device 130 is configured to include a predefined set of traffic classes based upon a knowledge base gleaned from observation of common or known traffic types on current networks. Data compression device 130, in one embodiment, also allows an administrator to manually create a traffic class by specifying a set of matching attributes. As discussed above, administrator interface 150, in one embodiment, allows for selection of a traffic class and the configuration of traffic management policies for the selected traffic class. Administrator interface 150, in one embodiment, also allows for the selection and arrangement of traffic classes into hierarchical reference trees. In one embodiment, traffic classification engine 96 also stores traffic classes added by the traffic discovery module. Furthermore, as discussed below, data compression device 130 may also include traffic class discovery functionality that automatically adds traffic classes to traffic classification engine 96 in response to data flows traversing the device. Automatic network traffic discovery and classification is disclosed in U.S. Pat. Nos. 6,412,000, 6,457,051, and 6,591,299, which are incorporated herein by reference.

Traffic classification engine 96, in one implementation, stores traffic classes associated with data flows that traverse access link 21. Traffic classification engine 96, in one embodiment, stores the traffic classes and corresponding data (e.g., matching rules, policies, partition pointers, compression algorithm identifiers, etc.) related to each traffic class in a hierarchical tree. This tree is organized to show parent-child relationships—that is, a particular traffic class may have one or more subordinate child traffic classes with more specific characteristics (matching rules) than the parent class. For example, at one level a traffic class may be configured to define a particular user group or subnet, while additional child traffic classes can be configured to identify specific application traffic associated with the user group or subnet. U.S. application Ser. No. 10/334,467, as well as other patents and patent applications identified above, disclose how traffic classification engine 96 traverses the hierarchical tree to match a data flow to a leaf traffic class node.

In one embodiment, the root traffic classifications are "/inbound", and "/Outbound" data flows. Any data flow not explicitly classified is classified as "/Inbound/Default" or "/Outbound/Default". In other implementations, the concept of "inbound" and "outbound" is replaced by a set of policies corresponding to pairs of network interfaces, such as interfaces 71 and 72, and the direction of packet traffic. For example, packets flowing from network interface 71 to network interface 72 (and vice versa) can be classified on that basis to eliminate any potential restrictions on classification of data flows in different network topologies. A "LocalHost" traffic class, in one implementation, corresponds to packets and data flows destined for data compression device 130, such as requests for stored measurement data, or device configuration changes. In one embodiment, traffic classification engine 96 attempts to match to a leaf traffic class node before proceeding to remaining traffic class nodes in the hierarchical configuration. If a traffic class is found, the traffic classification engine 96 stops the instant search process and returns the identified traffic classification. Of course, one skilled in the art will recognize that alternative ways for traversing the hierarchical traffic class configuration can be implemented. For example, traffic classification engine 96 may be configured to traverse all traffic class nodes at a given level before proceeding to lower levels of the traffic classification tree.

In one embodiment, administrator interface 150 displays the traffic class tree and allows for selection of a traffic class and the configuration of policy for that traffic class. Administrator interface 150 also allows for the arrangement of traffic classes into a hierarchical classification tree. Data compression device 130 further allows an administrator to manually create a traffic class by specifying a set of matching rules and also automatically creates traffic classes by monitoring network traffic across access link 21 and classifying data flows according to a set of criteria to create matching rules for each traffic type. In one embodiment, each traffic class node includes a traffic class identifier; at least one traffic class (matching) attribute; at least one policy parameter (e.g., a bandwidth utilization control parameter, etc.), a pointer field reserved for pointers to one to a plurality of child traffic classes. In one embodiment, traffic classification engine 96 implements a reference tree classification model wherein separate traffic classification trees can be embedded in traffic class nodes of a given traffic classification tree. U.S. application Ser. No. 10/236,149, incorporated by reference herein, discloses the use and implementation of embeddable reference trees.

A.3. Data Rate Control

As discussed above, rate control module 94 applies the traffic policies identified in the control block object corresponding to various flows. For example, rate control module 94, in one implementation, is operative to enforce bandwidth utilization controls on data flows traversing access link 21. A bandwidth utilization control for a particular data flow can comprise an aggregate control bandwidth utilization control, a per-flow bandwidth utilization control, or a combination of the two. Rate control module 94 can use any suitable functionality to enforce bandwidth utilization controls known in the art, including, but not limited to weighted fair queuing, class-based weighted fair queuing, Committed Access Rate (CAR) and "leaky bucket" techniques. Rate control module 94 may incorporate any or a subset of the TCP rate control functionality described in the cross-referenced U.S. patents and/or patent applications set forth above for controlling the rate of data flows. Data compression device 130, however, can also be configured to implement a variety of different policy types, such as security policies, admission control policies, redirection policies, caching policies, transcoding policies, and network address translation (NAT) policies. Of course, one of ordinary skill in the art will recognize that other policy types can be incorporated into embodiments of the present invention.

A.3.a. Aggregate Bandwidth Utilization Control

An aggregate bandwidth utilization control operates to manage bandwidth for aggregate data flows associated with a traffic class. An aggregate bandwidth utilization control can be configured to essentially partition the available bandwidth corresponding to a given access link. For example, a partition can be configured to protect a network traffic class by guaranteeing a defined amount of bandwidth and/or limit a network traffic class by placing a cap on the amount of bandwidth a traffic class can consume. Such partitions can be fixed or "burstable." A fixed partition allows a traffic class to use in the aggregate a defined amount of bandwidth. A fixed partition not only ensures that a specific amount of bandwidth will be available, but it also limits data flows associated with that traffic class to that same level. A burstable partition allows an aggregate traffic class to use a defined amount of bandwidth, and also allows that traffic class to access additional unused bandwidth, if needed. A cap may be placed on a burstable partition, allowing the traffic class to access up to a maximum amount of bandwidth, or the burstable partition may be allowed to potentially consume all available bandwidth across the access link. Partitions can be arranged in a hierarchy—that is, partitions can contain partitions. For example, the bandwidth, or a portion of the bandwidth, available under a parent partition can be allocated among multiple child partitions. In one embodiment, at the highest level, a partition exists for all available outbound bandwidth, while another partition exists for all available inbound bandwidth across the particular access link. These partitions are then sub-dividable to form a hierarchical tree. For example, an enterprise employing static partitions may define a static partition for a PeopleSoft software application traffic class, and sub-divide this parent partition into a large burstable child partition for its human resources department and a smaller burstable child partition for the accounting department. U.S. patent application Ser. No. 10/108,085 includes a discussion of methods for implementing partitions, as well as novel solution for implementing partitions arranged in a hierarchical allocation scheme.

In one embodiment, a partition is created by selecting a traffic class and configuring a partition for it. As discussed above, configurable partition parameters include 1) minimum partition size (in bits per second); 2) whether it is burstable (that is, when this option is selected, it allows the partition to use available excess bandwidth; when the option is not selected the partition has a fixed size); and 3) maximum bandwidth to be used when the partition bursts.

Figure 3:
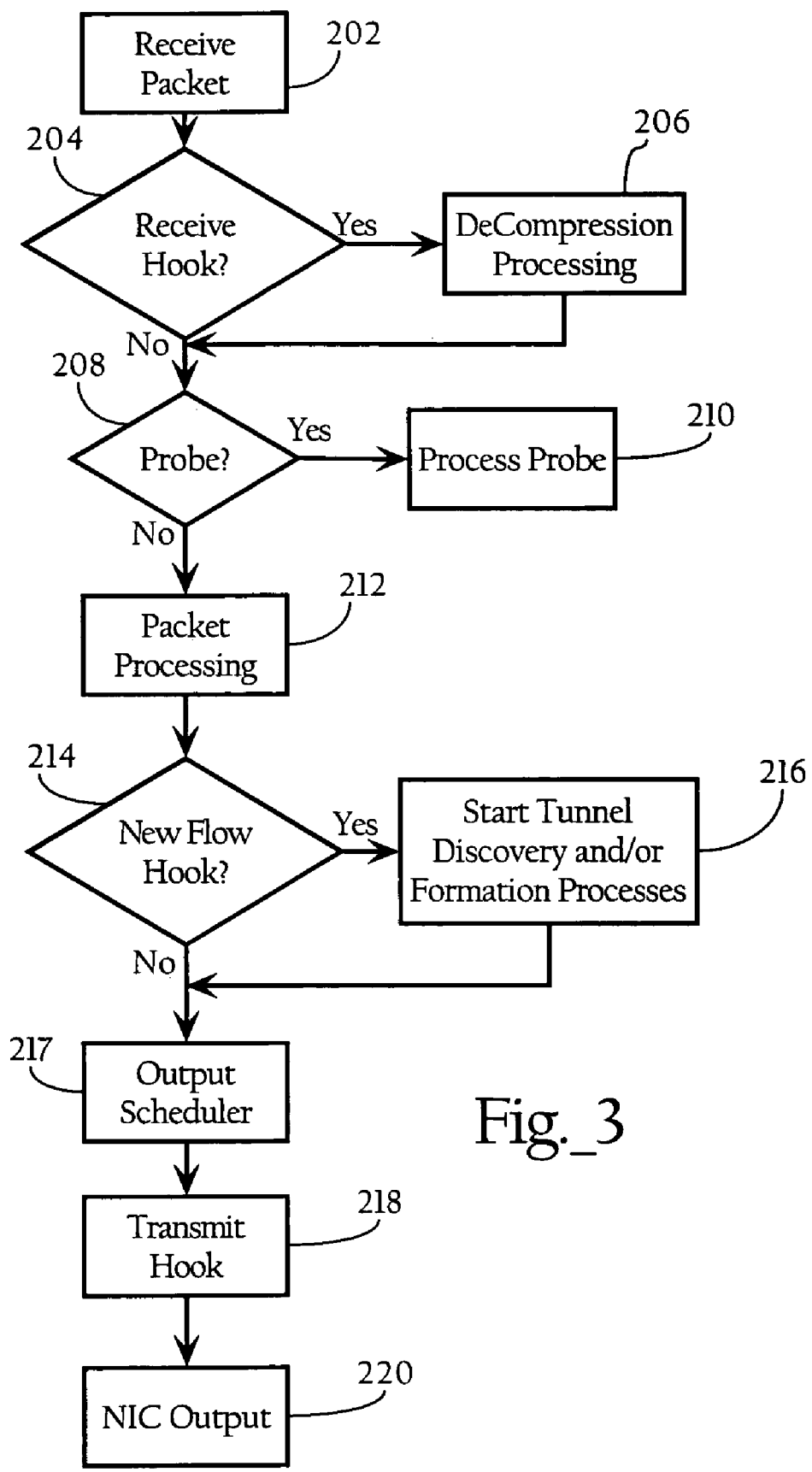
FIG. 3 is a flow chart diagram showing a method, according to one implementation of the present invention, directed to processing data flows.

Still further, in one implementation discussed below, rate control module 94 in a first process operates to place packets on a corresponding partition queue depending on a partition associated with a traffic class or network application corresponding to the flow. A separate, output scheduling process arbitrates among the partition queues selecting packets for output. As FIG. 3 illustrates, certain compression-related operations are performed on packets after the packets have been placed onto partition queues, and after the output scheduler pops the packets from the partition queues.

A.3.b. Per-Flow-Bandwidth Utilization Controls

Rate control module 94 is also operative to enforce per-flow bandwidth utilization controls on traffic across access link 21. Whereas aggregate bandwidth utilization controls (e.g., partitions, above) allow for control of aggregate data flows associated with a traffic class, per-flow bandwidth utilization controls allow for control of individual data flows. In one embodiment, rate control module 94 supports different bandwidth utilization control types, including, but not limited to, priority policies, rate policies, and discard policies. A priority policy determines how individual data flows associated with a traffic class are treated relative to data flows associated with other traffic classes. A rate policy controls the rate of data flows, for example, to smooth bursty traffic, such as HTTP traffic, in order to prevent a TCP end system from sending data packets at rates higher than access link 21 allows, thereby reducing queuing in router buffers and improving overall efficiency. U.S. patent application Ser. No. 08/742,994 now U.S. Pat. No. 6,038,216, incorporated by reference above, discloses methods and systems allowing for explicit data rate control in a packet-based network environment to improve the efficiency of data transfers. Similarly, U.S. Pat. No. 6,018,516, incorporated by reference above, discloses methods and systems directed to minimizing unneeded retransmission of packets in a packet-based network environment. A rate policy can be configured to establish a minimum rate for each flow, allow for prioritized access to excess available bandwidth, and/or set limits on total bandwidth that the flow can consume. A discard policy causes rate control module 94 to discard or drop data packets or flows associated with a particular traffic class. Other policy types include redirection policies where an inbound request designating a particular resource, for example, is redirected to another server.

A.4. Compression and Tunneling

Compression module 98 is operative to establish and maintain compression tunnels with compatible routing nodes or other network devices in a communications path. For example, compression module 98 on network device 130a (see FIG. 1) may establish a tunnel with a similar compression module implemented on network device 130b or another device such as intermediate node 60c. In one embodiment, compression module 98 includes data compression functionality and tunneling functionality based on standard transport and encapsulation protocols. In one embodiment, compression module 98 includes a variety of compression tunnel capabilities, including the ability to employ different transport and encapsulation protocols, as well as different data compression algorithms. In addition, compression module 98, as discussed in more detail below, include adaptive codebook generation functionality that controls updates to one or more compression codebooks.

Compression functionality generally transforms data packets (or other blocks of information) from a first state to a second, smaller state. Compatible de-compression functionality is operative to transform the data from the second smaller state to substantially the first state. For example, according to some algorithms and data formats, de-compression does not recover all of the original data. Transformation functionality may include a variety of types and protocols. For example, compression module 98 may include compression and/or decompression functionality, caching functionality, and encryption and/or decryption functionality, all of a variety of types and configurations. For example, compression module 98 may include a plurality of data compression capabilities, such as compression functionality optimized for different kinds of data (e.g., text files, image files, audio files, etc.) or network application types. Data transformation can be performed on just the packet data, the header data, or on the entire packet depending on the implementation. In one implementation, compression module 98 may apply different compression techniques to the headers and payloads of individual packets. In addition, compression module 98 can operate on packets individually, or collect packets and transform them on an aggregate basis. In addition, compression module 98 may operate to transform data from one compression format to another compression format, such as converting image data files from one format to another.

Compression module 98 is also operative to handle the path between data compression device 130 and the tunnel partner corresponding to the path, using encapsulation and transport technologies, such as Generic Routing Encapsulation (GRE) protocol (RFC 2890), IP in IP Tunneling protocol (RFC 1853), and/or any other suitable protocol. Compression module 98 also includes tunnel management functionality allowing for maintenance of tunnel state information, as well as recovery functionality that handles loss of tunnels, routing failures and other transmission errors, such as lost or out-of-order packet transmissions (if applicable to the compression protocol).

In one embodiment, compression module 98 is operative to probe communication paths for routing nodes or other network devices that include compatible compression and tunneling capabilities. For example, U.S. patent application Ser. No. 10/015,826, incorporated by reference herein, discloses methods for probing a communications path for compatible tunnel partners. Using this technology, data compression device 130a (see FIG. 1), for example, may transmit probe requests along the communications path to end system 28, which may be intercepted by data compression device 130b. As discussed in the above-identified application, data compression device 130a processes probe responses to identify an appropriate compression tunnel partner, such as data compression device 130b.

Compression module 98, in one implementation, comprises a plurality of compression algorithm, sub-modules each corresponding to a given compression algorithm or a given implementation of a compression algorithm. In one implementation, each compression algorithm sub-module has associated with it a set of functions to handle initialization, compression, de-compression, backup (optional) and close. Suitable compression algorithms include LZ77, LZ78, Lempel-Ziv-Welch (LZW), deflate (zlib), CNA, and ICNA algorithms. In one implementation, compression module 98 maintains a compression algorithm table listing various attributes of each supported compression algorithm. In one implementation, the compression algorithm table is indexed by an algorithm's compression type or some other unique identifier. A given compression algorithm can be applied to traffic corresponding to different network applications or other traffic classes by changing the configuration of the corresponding traffic class object maintained by traffic classification engine 96 to identify the desired compression algorithm as the active compression algorithm.

As discussed above, a compression algorithm is the particular method used to reduce the size of transferred network traffic prior to transmission across a communications medium. A compression algorithm may operate on input data or stream in fixed-length bit patterns or input symbols. For example, some compression algorithms compress a data stream on a byte-by-byte basis. Other compression algorithms may operate on the input data or stream in variable segments. Most compression algorithms involve spotting repeated sequences in the data and storing these sequences for quick look-up searches later in a codebook. A compression dictionary or codebook is a location where an algorithm stores its data sequences, predictions, shortened substitutions, and/or any other data it needs to do its job. A compression codebook, in one implementation, is a compilation of common patterns of characters and the shorter strings with which they are replaced when the data is sent across a network. Associated with each compression codebook is a compression algorithm, such as Lempel-Ziv/Huffman. Compression codebooks come in different sizes: the smaller codebooks are faster at compressing data while the larger codebooks achieve higher compression ratios. In one implementation, compression module 98 may maintain separate codebooks for each tunnel partner it discovers in the case of dynamic compression codebooks. Network traffic must be decompressed with the same codebook with which it was compressed. Accordingly, before compressing, compression module 98 may check with its partner to make sure that the correct codebook (or a common base codebook) is available. If that codebook or corresponding compression algorithm is not available, it will look for one that they both have and will use that common codebook to compress the data. In one implementation, codebook selection is handled during the compression tunnel discovery phase.

In addition, compression module 98 also includes a flow table that keeps track of the active data flows on which compression module 98 operates. In one implementation, the flow table includes the following fields: 1) flow ID; 2) tunnel address; 3) compression ID, 4) codebook ID, and 5) network application. Flow identifier is a string or hashed value that identifies the flow (see Section A.1., above). The tunnel address is the IP or network address of the remote tunnel endpoint. Codebook ID identifies the active codebook used to compress the data packets in the flow. Network application refers to the network application corresponding to the data flow. Compression ID refers to the compression algorithm currently applied to the data flow.

Compression module 98, in one implementation, selects the compression algorithm that is applied to a given data flow depending on the network application into which the data flow is classified. Of course, in other implementations, compression module 98 may apply the same compression algorithm to all network traffic. In other implementations, compression algorithm selection is based on the capabilities and supported algorithms of a tunnel partner identified during a discovery phase. Still further, as discussed herein, compression module 98 maintains, on a network application basis, the size of the packets prior to compression by a given compression sub-module, and after compression by the compression sub-module. In one implementation, these raw compression statistics can be maintained by measurement engine 140 and accessed by a separate process. From these statistics, a compression ratio can be computed for each compression algorithm on a per-network-application basis. These compression ratios allow compression module 98 to examine the performance of compression algorithms applied to a given network application over a given time interval.

A.4.a. Overall Process Flow Including Compression Functionality

FIG. 3 provides a method, according to one implementation of the present invention, illustrating how data compression device 130 applies compression and other functions to packets traversing access link 21. In one implementation, integration of compression functionality with other processing on the packet path is accomplished using compression hooks that check if a given packet is to be operated on, intercepted or ignored. In one implementation, the compression receive hook intercepts received tunneled packets, such as IPCOMP packets (202, 204). Tunneled packets are passed to compression module 98, which decompresses the packets and re-injects them on the packet path (206). As FIG. 3 illustrates, incoming packets are also checked to determine whether they are probe packets (208) transmitted by a remote network device in an effort to discover a tunnel partner and establish a compression tunnel. If so, the probe packet is also passed to compression module 98 for appropriate processing (210). Data compression device 130 then processes the packets according to its standard packet processing mechanisms (212) as discussed more fully below. For example, data compression device 130 may include network application traffic management functionality that is operative to manage bandwidth utilization, or accelerate network traffic, across the access link, in addition to the compression functionality described herein.

After packet processing, a new flow hook checks to determine whether the packet represents part of a new flow and/or whether the identified network application associated with the flow has changed (214). The new flow hook may also trigger tunnel discovery and/or formation operations if the flow data associated with the packet warrants it (see FIG. 4). As discussed in more detail below, the new flow hook also provides a flow and its associated packets a compression id assignment (if possible). Compression ids are used to index into compression entries that contain tunnel partner information, compression encoding information, and the like. An output scheduler then operates on packets placed in various queues by rate control module 94. After processing by the output scheduler, a compression transmit hook intercepts compressible packets (218), which are operated on by compression module 98, prior to the packets being read onto the transmit queues of the network interfaces 71 or 72 (220).

Figure 4:
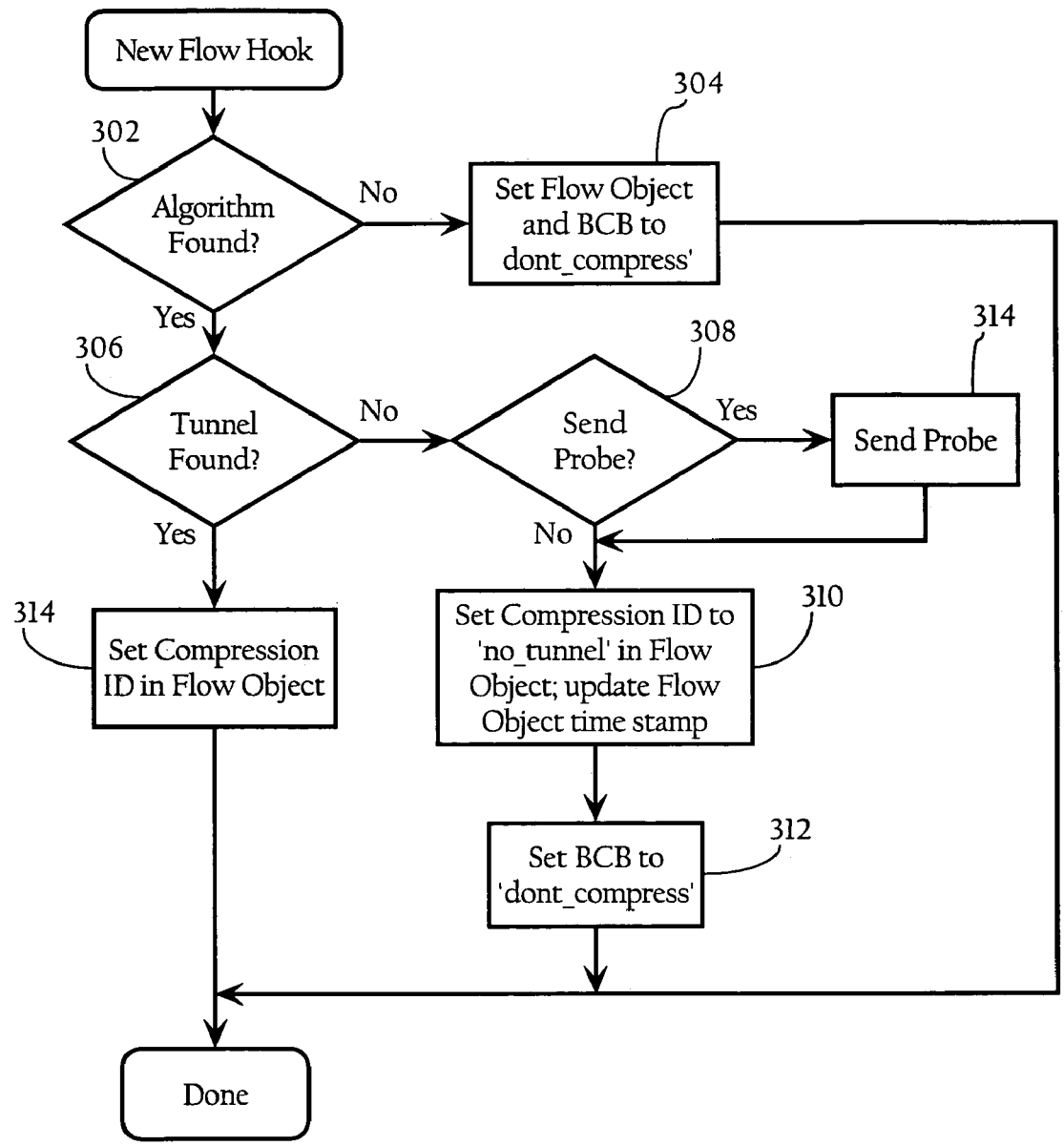
FIG. 4 is a flow chart diagram illustrating operation of a new flow hook according to one implementation of the present invention.

FIG. 4 illustrates operation of the new flow hook according to one implementation of the present invention. In one implementation, the new flow hook first determines whether data flow has been sufficiently classified or analyzed such that suitable compression algorithms can be identified for the data flow. As discussed above, data compression device 130 may apply different compression algorithms to different classes of network traffic. For example, in one implementation, compression module 98 maintains a network application table that identifies the compression algorithm to be applied to a given network application. In many implementations, data compression device 130 does not compress all types of network traffic. Furthermore, it may take more than one packet to fully determine a network application for a flow and, therefore, to determine whether a compression algorithm can be applied. Accordingly, when a network application is identified, the flow object generally contains a service type identifier for the network application. The new flow hook uses the service type identifier to determine whether a corresponding entry exists in the network application table and, if so, sets the compression id in the flow object. If the new flow hook does not find a compression algorithm for the data flow, it sets the compression ID field in the flow object corresponding to the flow, and the compression ID in the packet wrapper (BCB) corresponding to the packet, to 'dont_compress' (304). Packets with compression IDs set to "dont_compress" are ignored by the transmit hook and are not sent through a compression tunnel. Otherwise, the new flow hook then determines whether a tunnel partner is available for the data flow (306). If there is no current tunnel that can be used for the flow, the new flow hook determines whether another probe request should be sent along the communications path to the destination host (308, 314). The new flow hook then sets the compression ID in the flow object to "no_tunnel" (310), and sets the compression ID in the packet wrapper to "dont_compress" (312).

Figure 5:
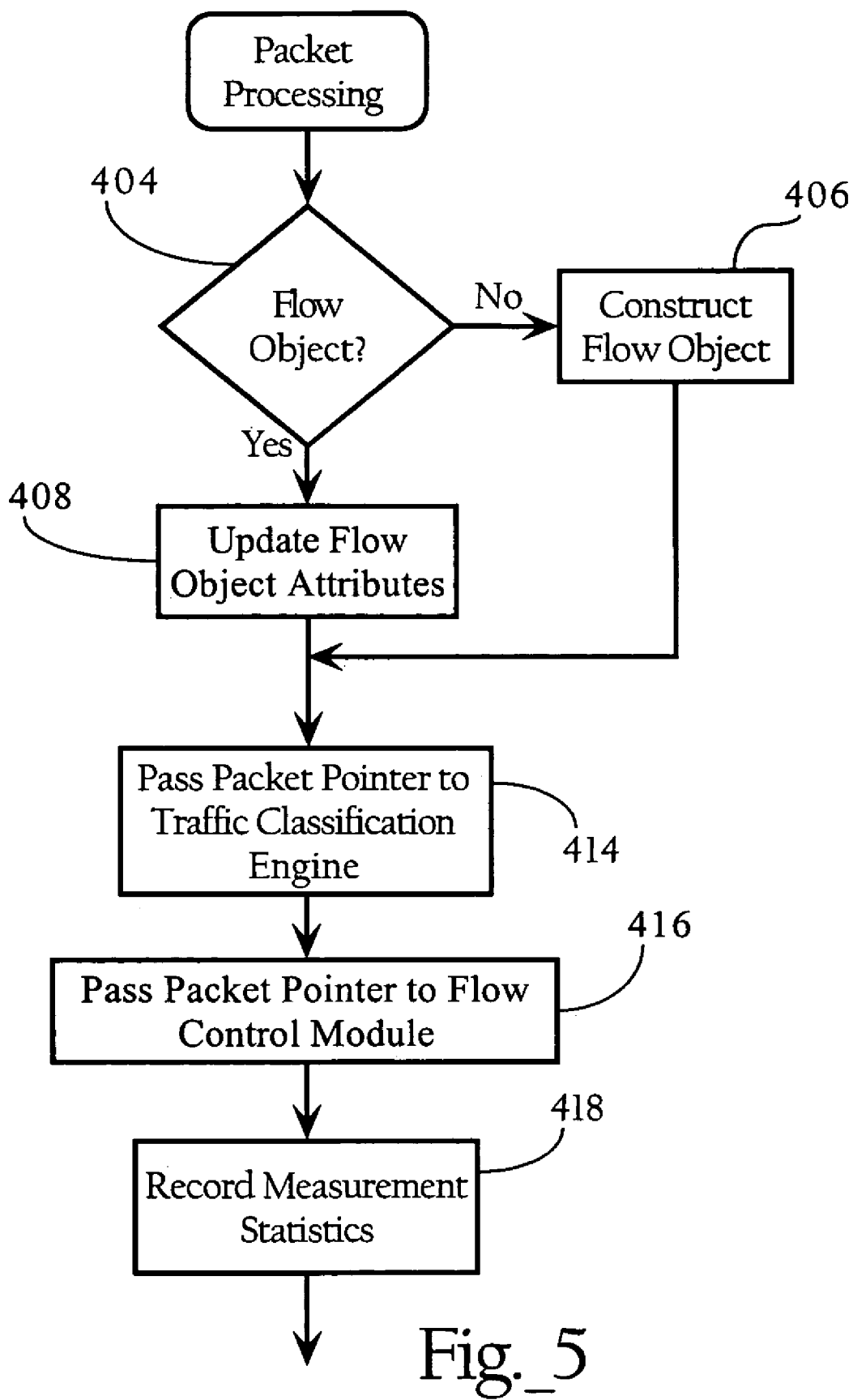
FIG. 5 is a flow chart diagram illustrating a sequence of packet processing operations, according to one implementation of the invention.

FIG. 5 illustrates for didactic purposes various operations that may be performed on the packets traversing data compression device 130, according to one implementation of the present invention. In one embodiment, packet processor 92, in response to a received data packet, determines whether flow database 135 contains an existing control block object corresponding to the data flow (404) (see Section A.1., supra). If no control block object corresponds to the data packet, packet processor 92 constructs a control block object including attributes characterizing the data flow, such as source address, destination address, etc. (406) (see above). In one embodiment, packet processor 92 analyzes the source and destination IP addresses in the packet header and scans host database 134 for matching entries. If no matching entries exist, packet processor 92 creates new entries for the source and destination IP addresses. As discussed above, in one embodiment, a control block object contains a flow specification object including such attributes as pointers to the "inside" and "outside" IP addresses in host database 134, as well as other flow specification parameters, such as inside and outside port numbers, protocol type, pointers to variable-length information in a dynamic memory pool, and other parameters characterizing the data flow.

As FIG. 5 illustrates, packet processor 92 updates, for existing data flows, attributes of the flow object in response to the packet such as the packet count, last packet time, and the like (408). Packet processor 92 can also perform other operations, such as analyzing the packets for connection state information. For example, packet processor 92 can inspect various TCP flags to determine whether the received packet is part of a new data flow or represents a change to an existing data flow (such as the first data packet after the TCP handshake). Methods for determining new data flows and assigning packets to existing data flows are well known in the art and also depend on the particular transport layer protocol employed. For a TCP packet, packet processor 92 can determine a new data flow by detecting SYN and/or SYN/ACK packets. However, a new data flow can simply be a data flow for which there is no corresponding control block object in flow database 135. In addition, with UDP and GRE flows (where there is no explicit connection mechanism, such as SYN packets), a new flow is recognized by associating the source and destination addresses and port numbers to the flow and the flow type (e.g., UDP, GRE, etc.). Accordingly, when a UDP packet identifies a new address/port pair, the attributes discussed above are stored in a data structure along with the time of last packet. A new UDP flow between the same address/port pairs can be determined by comparing the last packet time to a threshold value (e.g., 2 minutes). If the difference between the time of the latest packet and the time of the last packet is greater than the threshold, the new packet is deemed part of a new flow. In another embodiment, a separate process monitors the last packet times associated with UDP, GRE and similar flow types to detect termination of a given flow.

As FIG. 5 illustrates, packet processor 92 then passes a pointer to the packet, in one implementation, to traffic classification engine 96, which operates as discussed above to determine service IDs for, and otherwise classify, the data flow (414). Lastly, the packet is passed to rate control module 94 (418), which performs rate control operations on the data packets, such as placing the packet on a partition queue, performing TCP rate control operations, and the like. As FIG. 5 illustrates, data compression device 130 may also perform other operations in response to arrival of the packet. For example, measurement engine 140 may record certain measurement variables on an aggregate or per-traffic class basis (418).

A.4.b. Controlled Dynamic Codebook Regeneration

Figure 6:
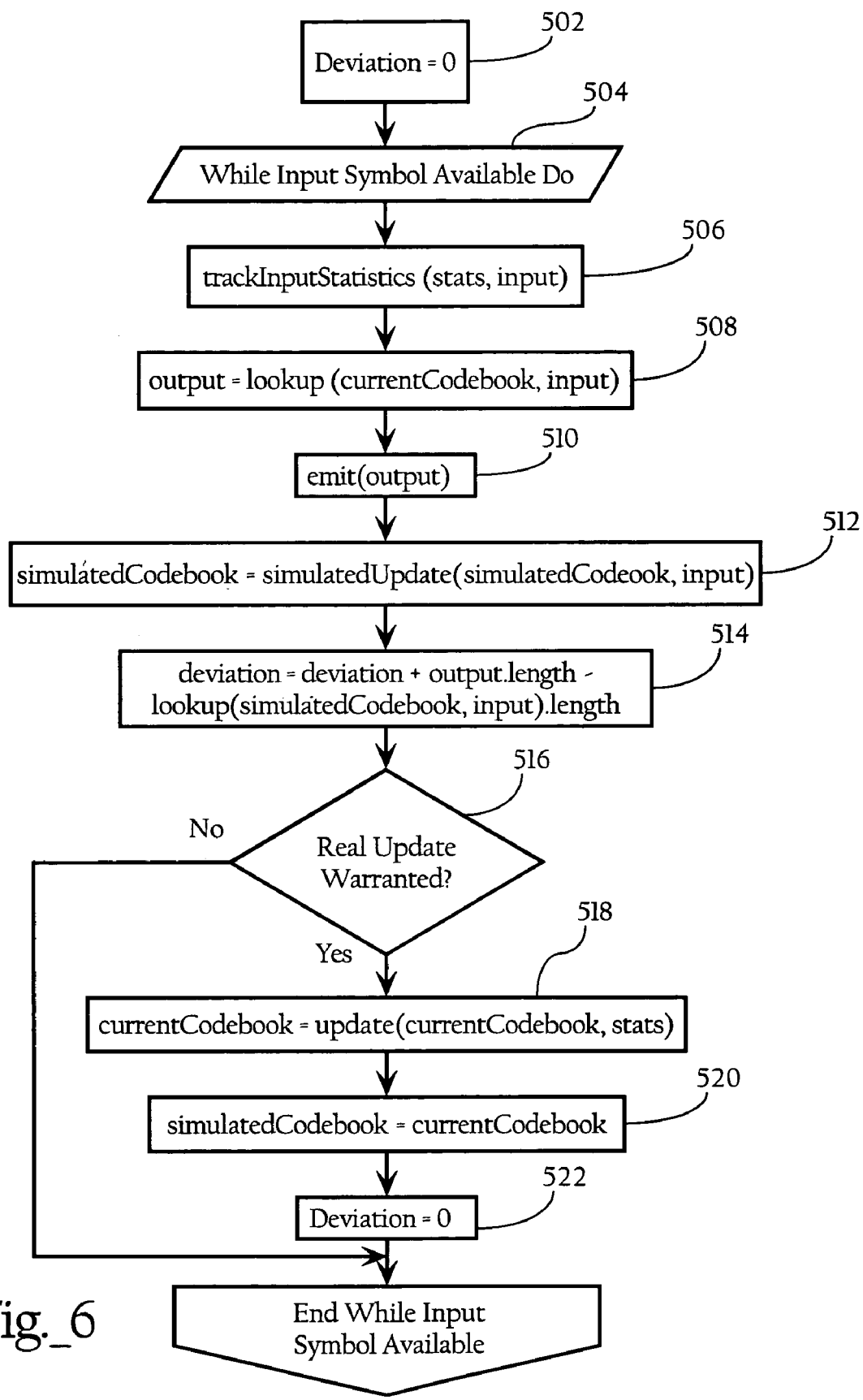
FIG. 6 is a flow chart diagram providing a method, according to one implementation of the present invention, directed to an adaptive, controlled codebook updating mechanism for one or more compression algorithms.

FIG. 6 illustrates a process flow, according to one implementation of the present invention, directed to controlling updates to one or more dynamic codebooks maintained by compression module 98. Compression module 98, in one implementation, executes the process illustrated in FIG. 6 for a given compression algorithm and a given remote tunnel partner (i.e., a unique remote tunnel partner and compression algorithm pair). As FIG. 6 illustrates, compression module 98 maintains a deviation value (502) for the remote tunnel partner and compression algorithm pair. The deviation value characterizes the aggregate difference (in bits) between the compressed output resulting from the current codebook (currentCodebook) and the output that would have resulted if the codebook had been updated (simulatedCodebook). In one implementation, the simulated codebook predicts the length of the compressed output had the codebook been regenerated with each input symbol. However, in other implementations, other simulated regeneration frequencies can be used. As FIG. 6 illustrates, while input symbols are available to compress (504), compression module 98 maintains input statistics, such as the identity of an input symbol, and a symbol count on a per-input symbol basis for the current codebook (506).

As FIG. 6 illustrates, compression module 98 computes a compressed output, given the current input symbol based on the current codebook (508), and emits the compressed output (510), for example, to another process associated with data compression device 130, such as an output scheduler. Compression module 98 then executes a simulated codebook process (512). In one implementation, the simulated codebook process maintains data relevant to computing the length of the output that would have resulted if the codebook had been allowed to re-generate. In one implementation, an input symbol is a pattern of bits having a fixed width, such as eight bits (byte). In one implementation, compression module 98, as part of the simulated codebook process, maintains a queue of the input symbols, as well as an input symbol table that stores data relating to the input symbols, encountered over a sliding window. For example, the sliding window may be configured to be the last N input symbols, where N equals 512, 1024 or other value. In one implementation, the size of the sliding window may be a configurable parameter. One skilled in the art will recognize that as the size of sliding window increases, the response characteristics or sensitivity of the algorithm relative to incoming symbols decreases. In one implementation, the input symbol table maintains, for each input symbol, a count of the number of times a corresponding input symbol was encountered over the sliding window. Accordingly, as a new input symbol is processed, the simulated codebook process pops the first input symbol from the sliding window queue and decrements the count in the input symbol table corresponding to the first input symbol. The simulated codebook process then places the new input symbol on the queue and increments the count in the input symbol table corresponding to the new input symbol. Compression module 98 then adjusts the deviation value based on the bit-length of the output resulting from the current codebook (output.length) and the bit-length of the output that would have resulted based on the simulated codebook (514). To yield the output length using a simulated codebook, compression module 98, in one implementation, applies an algorithm that returns the bit-length of an output based on the input symbol and the probability of occurrence of the input symbol. In one implementation, the probability of occurrence of a given input symbol is based on the size of the sliding window, and the number of times the input symbol has been encountered over the sliding window. In one implementation, the expected bit-length of the simulated code book is based on an element of the entropy formula according to the following equation:

$$\text{simulated\_output\_length} = -1 \times \log_2 (\text{symbol\_occurrence\_probability}).$$

In one implementation, symbol occurrence probability is a value between 0 and 1, computed by dividing the occurrence count of a given input symbol by the size of the sliding window. Given the foregoing formula, however, if the occurrence count for a given input symbol is zero, the compression module 98 uses a count of one instead.

In one embodiment, if the sliding window is a fixed parameter, compression module 98 may implement an approximated version of the foregoing simulated output length algorithm using a output length table that maintains an expected output symbol length (in bits) based on the count corresponding to the input symbol in the input symbol table (above). If the sliding window is a fixed parameter, the output length table may be a hard-coded data structure. In another implementation, compression module 98 may generate the output length table during a startup phase by checking the value of a configurable sliding window parameter and computing integer values for entries in the table. In yet another implementation, compression module 98 may apply the simulated output length algorithm as needed without the use of tables. Given the foregoing, computing the simulated output length for a given input symbol is computationally inexpensive relative to actual regeneration of the codebook. In the implementation shown, compression module 98 updates the deviation value with each new input symbol. In some circumstances, the current codebook, as compared to the simulated codebook, may actually yield smaller outputs for some symbols and larger outputs for other symbols. Accordingly, the deviation value may increase or decrease as each input symbol is processed. Accordingly, embodiments of the present invention, as discussed below, conserve CPU resources which can be used to increase data throughput, only generating codebook updates when needed, as discussed below.

As FIG. 6 shows, compression module 98 then determines whether an actual update of the current codebook is warranted (516). In one implementation, if the deviation value is greater than a threshold value (such as 64 bits), compression module 98 regenerates the current codebook (518), and resets the count values in the input symbol table (520) and the deviation value (522). As discussed above, the threshold value represents an engineering or design choice that it is worth regenerating the current codebook based on the impact on data throughput caused by utilization of CPU cycles (and potentially other resources) to regenerate the codebook. Accordingly, the deviation threshold may vary considerably without departing from the scope of the invention. In addition, compression module 98 may base the decision to update the current codebook on other factors in addition to, or in lieu of, the deviation value. For example, compression module 98 may base this determination at least in part on the difference between the current codebook and a simulated codebook.

Compression tunnel partners (e.g., data compression devices 130a, 130b) should use the same codebook to compress and decompress incoming data. Accordingly, the codebook between two tunnel partners should be synchronized or initialized to the same value. As discussed above, tunnel partners, during a discovery phase, may negotiate the use of a baseline codebook. In one implementation, the baseline codebook may depend on the network application and/or network protocols employed. In addition, the tunnel partners should also use the same simulated codebook parameters, such as the same sliding window size, symbol occurrence probabilities, and deviation threshold values. In one implementation, compression tunnel partners may negotiate these simulated codebook parameters during tunnel discovery or at other times. In one implementation, at initialization between tunnel partners, the symbol occurrence probabilities are uniform across all input symbols. In another implementation, a set of non-uniform symbol occurrence probabilities developed from a knowledge base of input symbol probabilities can be used. In one implementation, one tunnel partner may simply transmit its simulated codebook parameters to another tunnel partner. In another implementation, the initial set of symbol occurrence probabilities, the sliding window and deviation threshold values are hard coded values and common to the tunnel partners.

After initialization, codebook synchronization between compression tunnel partners is substantially similar to conventional compression schemes in that the decompressing node decides whether the compressing side would have updated the codebook. In one implementation of the present invention, however, the decompressing node maintains the same deviation values, input symbol queue and input symbol tables to decide whether the compressing node has updated the codebook. In another embodiment, the compressing node can set a bit in an encapsulating header that indicates that a codebook update has occurred. The decompressing node can regenerate its codebook upon detection of the bit. Accordingly, as discussed above, the tunnel partners, in this implementation, must use the same sliding window, deviation threshold, and symbol occurrence probabilities.

A variety of implementations that employ the present invention can be developed. For example, compression module 98 may adjust one or more simulated codebook parameters, such as the deviation threshold, based on the CPU idle time (where the deviation threshold decreases as CPU idle time increases, and vice versa). Compression module 98 may also maintain separate codebooks and codebook regeneration processes for different network applications or other network traffic types. Still further, the control of dynamic codebook updates, in one implementation, can be turned on or off for specified network applications. Lastly, although the present invention has been described as operating in connection with end systems and networks employing the TCP, IP and Ethernet protocols, the present invention has application in computer network environments employing any suitable transport layer, network layer and link layer protocols. Still further, the present invention can be used in connection with a wide variety of compression algorithms. Lastly, while the embodiments described above involve network devices, the present invention can also be incorporated into data storage devices that use compression to reduce the size of stored data. In addition, the adaptive codebook control functionality may also be incorporated into end systems, such as a client computer and/or server, as opposed to the intermediate data compression devices 130a, 130b. Accordingly, the present invention has been described with reference to specific embodiments. Other embodiments of the present invention will be apparent to one of ordinary skill in the art. It is, therefore, intended that the claims set forth below not be limited to the embodiments described above.

What is claimed is:

1. In a data compression mechanism, a method for controlling updates to a codebook used to compress data, the method comprising
    receiving input data comprising at least one input symbol;
    transforming at least a portion of the input data to compressed output data using a first codebook, the compressed output data having a length;
    computing, according to a simulated codebook process, a simulated output length based on the input data;
    maintaining an aggregate output length deviation between the length of the compressed output data and the simulated output length;
    conditionally updating the first codebook based at least in part on the aggregate output length deviation.

2. The method of claim 1 further comprising
    maintaining an input data history comprising a sliding window of the input symbols in the received input data.

3. The method of claim 2 wherein the simulated codebook process computes the simulated output length based at least in part on the input data history.

4. The method of claim 1 further comprising transmitting the compressed output data to a remote host.

5. The method of claim 1 wherein the input data comprises at least one packet transmitted from a destination host to a source host.

6. The method of claim 5 further comprising transmitting the compressed output data in at least one packet to a remote host.

7. In a data compression mechanism, a method for controlling updates to a codebook used to compress data, the method comprising
    receiving an input symbol;
    generating an output based on a first codebook and the input symbol, wherein the output has a length;
    updating an input symbol history based on the received input symbol;
    computing, according to a simulated codebook process, a simulated output length based on the input symbol and the input symbol history;
    adjusting an aggregate deviation value based on the difference between the length of the generated output and the simulated output length;
    conditionally updating the first codebook based at least in part on the deviation value.

8. The method of claim 7 wherein updating an input symbol history comprises
    storing previously received input symbols in a queue of input symbols; and
    popping, in response to the receiving step, a first input symbol in the queue; and
    placing the received input symbol on the queue.

9. The method of claim 7 wherein computing the length of the simulated output comprises
    determining, based on the input symbol history, an occurrence probability of the received input symbol;
    computing the simulated length of the output symbol based on the occurrence probability of the received input symbol.

10. The method of claim 8 wherein the simulated length of the output symbol is computed according to the relation:

$$\text{simulated\_output\_length} = -1 \times \log_2(\text{symbol\_occurrence\_probability}).$$

11. An apparatus including compression functionality, comprising
    a processor;
    at least one network interface,
    a memory;
    a compression module, physically stored in the memory, comprising instructions operable to cause the processor and the apparatus to:
        receive input data comprising at least one input symbol;
        transform at least a portion of the input data to compressed output data using a first codebook, the compressed output data having a length;
        compute, according to a simulated codebook process, a simulated output length based on the input data;
        maintain an aggregate output length deviation between the length of the compressed output data and the simulated output length;
        conditionally update the first codebook based at least in part on the aggregate output length deviation.

12. The apparatus of claim 11 wherein the compression module further comprises instructions operative to cause the processor and the apparatus to
    maintain an input data history comprising a sliding window of the input symbols in the received input data.

13. The apparatus of claim 12 wherein the simulated codebook process computes the second simulated output length based at least in part on the input data history.

14. The apparatus of claim 11 wherein the compression module further comprises instructions operative to cause the processor and the apparatus to
    transmit the compressed output data to a remote host.

15. The apparatus of claim 11 wherein the input data comprises at least one packet transmitted from a destination host to a source host.

16. The apparatus of claim 15 wherein the compression module further comprises instructions operative to cause the processor and the apparatus to
transmit the compressed output data in at least one packet to a remote host.

17. The apparatus of claim 11 wherein the compression module further comprises instructions operative to cause the processor and the apparatus to
establish compression tunnels with a remote network device in the communications path to one or more destination hosts; and
intercept outgoing data packets to the one or more destination hosts.

18. The apparatus of claim 11 further comprising
a tunnel probing module, physically stored in the memory, comprising instructions operable to cause the processor and the apparatus to:
dynamically probe a communications path to a destination host for at least one network device having compression capabilities; and
establish a compression tunnel with an identified network device in the communications path.

19. The apparatus of claim 18 wherein the tunnel probing module is operative to
transmit probe requests along the communications path to the destination host; and
receive probe responses from network devices in the communications path to the destination host.

* * * * *